United States Patent
Weber et al.

(10) Patent No.: US 11,656,588 B2
(45) Date of Patent: May 23, 2023

(54) DESIGN, CONTROL AND OPERATION OF FILTERS FOR TURBOMACHINES

(71) Applicant: Carl Freudenberg KG, Weinheim (DE)

(72) Inventors: Patrick Weber, Weinheim (DE); Georg Hirsch, Ubstadt-Weiher (DE); Thomas Schroth, Bobenheim-Roxheim (DE)

(73) Assignee: CARL FREUDENBERG KG, Weinheim (DE)

( * ) Notice: Subject to any disclaimer, the term of this patent is extended or adjusted under 35 U.S.C. 154(b) by 785 days.

(21) Appl. No.: 16/511,010

(22) Filed: Jul. 15, 2019

(65) Prior Publication Data

US 2020/0073348 A1    Mar. 5, 2020

(30) Foreign Application Priority Data

Aug. 30, 2018 (EP) .................................. 18191594

(51) Int. Cl.
*G05B 19/042* (2006.01)
*G06F 30/20* (2020.01)
(Continued)

(52) U.S. Cl.
CPC ....... *G05B 19/042* (2013.01); *B01D 46/0032* (2013.01); *B01D 46/442* (2013.01);
(Continued)

(58) Field of Classification Search
CPC ... G05B 19/042; G06F 30/20; F05D 2260/80; F05D 2270/11; F02C 7/055; F02C 7/052; B01D 46/003; B01D 46/442; B01D 46/10
See application file for complete search history.

(56) References Cited

U.S. PATENT DOCUMENTS

| 5,403,497 A | * | 4/1995 | Schultz | G01N 15/02 210/745 |
| 6,401,520 B1 | * | 6/2002 | Volkwein | G01N 15/0618 73/863.22 |

(Continued)

FOREIGN PATENT DOCUMENTS

| CN | 102441303 A | * | 5/2012 | ............ B01D 36/02 |
| CN | 106289836 A | * | 1/2017 | ............ G01M 99/00 |

(Continued)

OTHER PUBLICATIONS

English language translation of the Japanese Office Action, dated Aug. 24, 2020.

*Primary Examiner* — Vincent H Tran
(74) *Attorney, Agent, or Firm* — Leydig, Voit & Mayer, Ltd.

(57) ABSTRACT

A method for designing and/or controlling a filter assembly for the air supply to a turbomachine includes: calculating a current and/or an expected concentration of particles in air present at an inlet of at least one filter stage of the filter assembly as a function of a mean size of the particles; calculating a sensitivity spectrum that, depending on the mean size of the particles, indicates an extent to which a predetermined concentration of such particles has a negative effect on performance and/or on service life of the turbomachine; calculating, for at least one filter candidate usable in the filter stage and/or switchable on or off, a concentration of particles to be expected at an outlet of the filter from a concentration and filter properties of the at least one filter candidate; and calculating a quality rating from the concentration and a sensitivity spectrum.

9 Claims, 4 Drawing Sheets

(51) Int. Cl.
*B01D 46/00* (2022.01)
*B01D 46/44* (2006.01)
*F02C 7/05* (2006.01)

(52) U.S. Cl.
CPC .............. *F02C 7/05* (2013.01); *G06F 30/20* (2020.01); *G05B 2219/2614* (2013.01)

(56) References Cited

U.S. PATENT DOCUMENTS

| | | | |
|---|---|---|---|
| 8,323,384 B2* | 12/2012 | Derstler | B01D 46/521 95/286 |
| 2003/0233248 A1* | 12/2003 | Shingu | G06Q 30/02 703/7 |
| 2005/0229777 A1* | 10/2005 | Brown | B01D 46/44 96/417 |
| 2010/0003164 A1* | 1/2010 | Bourne | F24F 3/16 422/4 |
| 2012/0272632 A1* | 11/2012 | Lans | B01D 46/023 55/478 |
| 2014/0172497 A1 | 6/2014 | Kim et al. | |
| 2015/0278409 A1 | 10/2015 | Sakashita et al. | |
| 2018/0345198 A1* | 12/2018 | Kippel | B01D 46/0086 |

FOREIGN PATENT DOCUMENTS

| | | | | |
|---|---|---|---|---|
| CN | 208057242 U | * | 11/2018 | ........... B01D 46/008 |
| EP | 2466083 A1 | * | 6/2012 | ........... F01N 3/0256 |
| EP | 3121414 A1 | | 1/2017 | |
| EP | 3121415 A1 | | 1/2017 | |
| EP | 3293367 A1 | | 3/2018 | |
| JP | S60-098729 U | | 7/1985 | |
| JP | 2010255612 A | | 11/2010 | |
| JP | 2013104421 A | * | 5/2013 | |
| WO | WO 2016087302 A1 | | 6/2016 | |

* cited by examiner

DESIGN, CONTROL AND OPERATION OF FILTERS FOR TURBOMACHINES

CROSS-REFERENCE TO PRIOR APPLICATION

Priority is claimed to European Patent Application No. EP 18 191 594.3, filed on Aug. 30, 2018, the entire disclosure of which is hereby incorporated by reference herein.

FIELD

The invention relates to a method for designing and/or controlling a filter assembly for the air supply of a turbomachine, such as a gas turbine or a compressor.

BACKGROUND

The function of gas turbines, compressors and other turbomachines in which air is compressed can be impaired by particles in the supplied air. Many types of particles can accumulate in the turbomachine over time (fouling) and thus alter the aerodynamics of turbine blades, which reduces efficiency and necessitates a regular cleaning of the turbomachine. Certain types of particles can also directly damage turbine blades due to mechanical erosion and/or chemical corrosion.

The "Supply air filtration" brochure of Arbeitsgemeinschaft für sparsamen und umweltfreundlichen Energieverbrauch e.V. (1991) describes the problem in detail and shows how the service life and efficiency of the turbomachine can be improved through the suitable design of a filtration system for the air supplied to the turbomachine.

U. Schirmeister, F. Mohr, "Impact of Enhanced GT Air Filtration on Power Output and Compressor Efficiency Degradation", Proceedings of the ASME Turbo Expo 2016, Jun. 13-Jun. 17, 2016, Seoul, South Korea discloses that supply air filtration on its part causes a pressure loss in the air supply to the turbomachine and thus reduces the performance of the turbomachine. Thus, the filter with the best separation of particles is not also automatically the optimal filter from an economic point of view.

SUMMARY

In an embodiment, the present invention provides a method for designing and/or controlling a filter assembly for the air supply to a turbomachine, comprising: calculating a current and/or an expected concentration of particles in air present at an inlet of at least one filter stage of the filter assembly as a function of a mean size of the particles; calculating a sensitivity spectrum that, depending on the mean size of the particles, indicates an extent to which a predetermined concentration of such particles has a negative effect on performance and/or on service life of the turbomachine; calculating, for at least one filter candidate usable in the filter stage and/or switchable on or off, a concentration of particles to be expected at an outlet of the filter from a concentration and filter properties of the at least one filter candidate; calculating a quality rating from the concentration and a sensitivity spectrum; and assigning the at least one filter candidate and/or the filter assembly.

BRIEF DESCRIPTION OF THE DRAWINGS

The present invention will be described in even greater detail below based on the exemplary figures. The invention is not limited to the exemplary embodiments. Other features and advantages of various embodiments of the present invention will become apparent by reading the following detailed description with reference to the attached drawings which illustrate the following.

DETAILED DESCRIPTION

Figure 1:
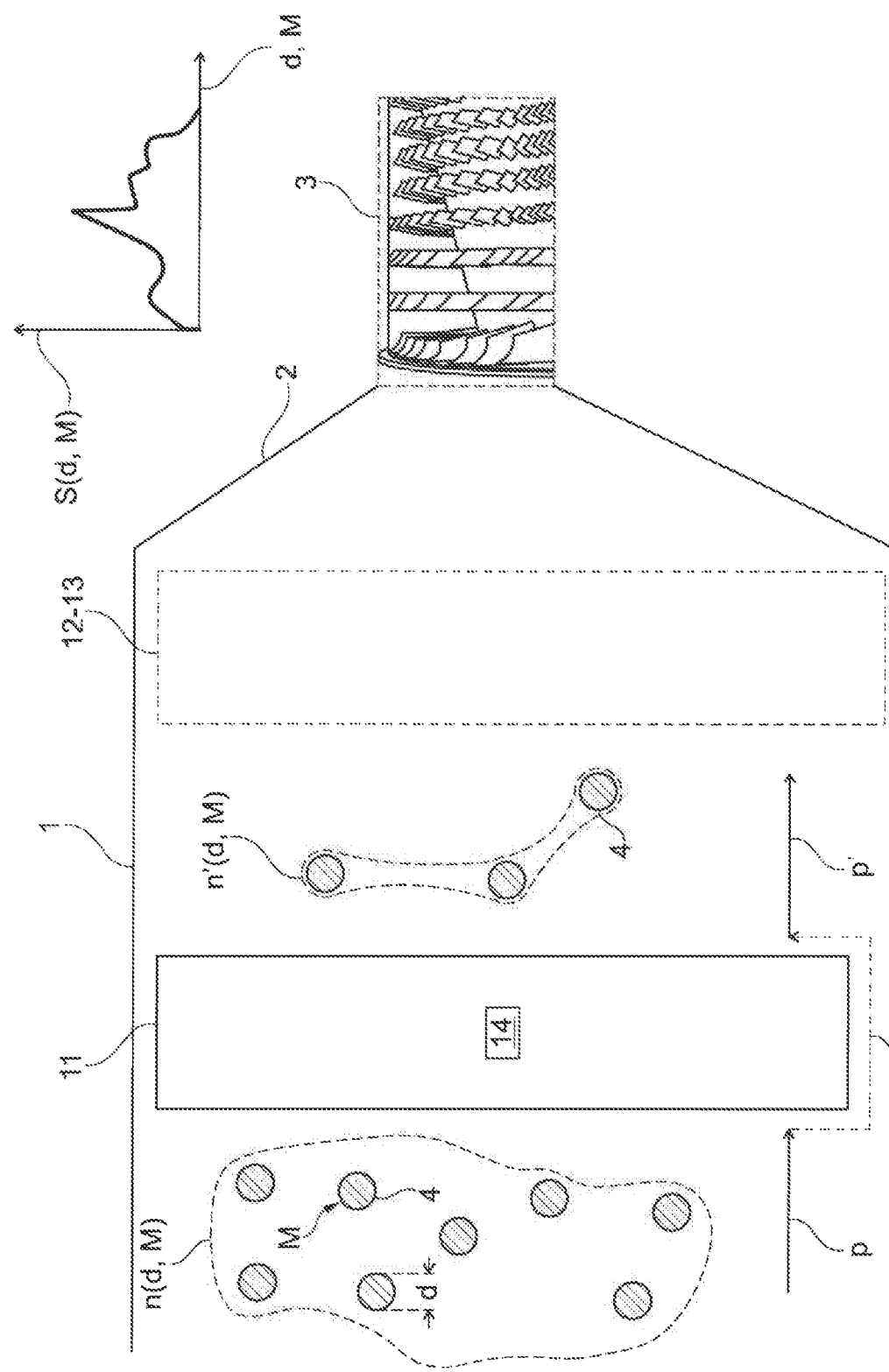
FIG. 1: Exemplary effect of a filter assembly 1 before an air supply 2 to a turbomachine 3.

In an embodiment, it is therefore the object of the invention to systematize and at the same time automate the design and/or control of filters for the air supply of turbomachines.

Within the scope of the invention, a method for the design and/or control of a filter assembly for the air supply to a turbomachine was developed.

With this method, a current and/or expected concentration $n(d)$ of particles in the air present at the inlet of at least one filter stage of the filter assembly is calculated as a function of the mean size d of the particles.

Such information can be obtained by any means. For example, in the context of designing the filter assembly, measurements can be carried out on the ambient air at the location of the turbomachine, i.e. at the intended place of use of the filter assembly. Likewise, a current and/or expected concentration of particles in the ambient air of the filter assembly can be obtained from an external data source, such as a weather service or an environmental authority.

A sensitivity spectrum $S(d)$ is calculated that, depending on the mean size d of the particles, indicates the extent to which a predetermined concentration of such particles has a negative effect on the performance and/or service life of the turbomachine. This sensitivity spectrum is based on a large data set of empirical values, wherein performance data of turbomachines are correlated with the present concentration $n(d)$ of particles at the inlet of the turbomachine.

It has been recognized that the susceptibility of a specific turbomachine to an impairment of operation, or even to damage, by particles that were sucked in, on the one hand, depends on the mean size of the particles and, on the other hand, is also highly specific for the specific turbomachine. For example, turbine blades are often hardened and tempered with thin functional layers, such as thermal insulation layers. These layers are destroyed much faster than the thick base material during an erosive attack. However, the destruction of the thermal barrier layer during operation immediately results in the failure of the base material, which is then also exposed to the high combustion temperature without protection. Therefore, the impact of larger particles, which can cause erosion, must be avoided.

Moreover, for example, the susceptibility to the accumulation of particles (fouling) is highly dependent on the geometry and also on the material of the turbine blades.

Finally, the susceptibility to chemical corrosion of turbine blades depends on the chemical composition of the particles, which in turn is correlated with the mean size d of the particles.

Thus, the sensitivity spectrum fulfills a function similar to the evaluation of biological efficiency in the equivalent dose for ionizing radiation. Depending on the type of radiation, the effectiveness of one and the same absorbed dose can vary by a factor of 20. In this analogy, the mean size d of the particles fulfills the function of the type of radiation.

If a specific turbomachine is susceptible to impairments caused by particles in a certain size range, such impairments will only occur if such particles are actually present in the supplied air. The specific demand for the type and strength of air filtration is thus determined by the interplay of the particle sizes arising at the location of the turbomachine and the susceptibility of the specific turbomachine depending on the particle size.

For example, it can occur that only a part of the particle sizes arising at the location of the turbomachine has a significant impairing or damaging effect on the turbomachine. It is then sufficient to filter out only such particles. All other particles can be let through by the filter assembly, which has multiple advantageous effects. The filter assembly is less expensive to manufacture and at the same time has a lower flow resistance; that is, if flowed through during the operation of the turbomachine, the pressure loss is lower. Finally, fewer particles overall are collected in the filter assembly, such that a longer operating time is possible until the filter has to be replaced.

Therefore, for at least one filter candidate that can be used in the filter stage and/or can be switched on or off, the concentration $n'(d)$ of the particles to be expected at the outlet of the filter stage is calculated from the concentration $n(d)$ and the filter properties of the filter candidate. A quality rating is calculated from the concentration $n'(d)$ and the sensitivity spectrum $S(d)$, and is assigned to the filter candidate and/or the filter assembly.

This quality rating can be used in multiple ways. For example, when designing the filter assembly, a list of possible filter assemblies can be sorted by values of the quality rating, in order to make a pre-selection and to facilitate the final selection of the filter assembly, which includes further criteria. The quality rating can also be used, for example, to find an optimal filter assembly with regard to the quality rating using an automated optimization method, such as a gradient descent method. Finding such an optimum in a manual process is not practicable, since the catalog of available filters comprises between 2,000 and 20,000 filters, depending on the area of application, and, with a multi-stage filter, the number of possible combinations is excessive.

The automated evaluation of the filter assemblies can take place on the basis of the known laws of fluid mechanics. It is standard that the separation rate of each filter depending on the mean size d of the particles and also the inflow velocity is examined in detail when the filter is placed on the market. Thus, for each filter in question, the concentration $n'(d)$ of the particles to be expected behind the filter is available for calculation.

However, the quality rating can also be used, for example, to control the filter assembly online. For example, the size-dependent concentration $n(d)$ of the particles present at the inlet to the filter stage can change depending on the weather conditions or the time of year. It can then be useful, for example, to activate or deactivate individual filter stages as required, or to change the control of an electrically operated filter. For example, pollen count increases at certain times of the year, yet it is significantly lower when it rains.

Irrespective of whether the method is used for preliminary design or for the online control of the filter assembly, the effect is the same: The separation of particles can be concentrated on those particles that are most disruptive for the operation or the service life. On the other hand, the filter assembly allows particles that the turbomachine can tolerate without any problem to pass unhindered. Thus, there is no unnecessary accumulation of such particles in the filter assembly that must be removed at some point, and no unnecessary flow resistance is introduced into the air supply. Thus, the pressure loss caused by the filter assembly is limited to what is necessary.

In a particularly advantageous arrangement, the pressure p of the air at the inlet of the filter stage is additionally used to determine the concentration $n'(d)$ of the particles to be expected at the outlet of the filter stage depending on the mean size d of the particles. In this manner, it can be taken into account that the filter performance of one and the same filter for one and the same mean size d of the particles depends on the inflow velocity at the inlet of the filter. For example, at low inflow velocities, the transport of the particles by diffusion is preferred, while at a certain velocity range, inertial forces lead to an increased separation of the particles in the filter. The pressure p can also contain a back pressure, which is caused by the inflow of the filter stage.

Therefore, in an additional advantageous embodiment, in addition to the expected concentration $n'(d)$ of the particles at the outlet of the filter stage, the expected pressure $p'$ of the air at the outlet of the filter stage is also calculated. The pressure $p'$ at the outlet of each filter stage in conjunction with the concentration $n'(d)$ at the outlet of the respective filter stage also gives the quantity flow of particles leaving the filter stage, which is dependent on the mean size d of the particles. Here, the quantity flow of particles leaving the last filter stage and thus entering the turbomachine is particularly important. For example, the required filter performance of the filter assembly can thus be specified in the form of a maximum permissible quantity flow of particles. The motivation for such a specification may be, for example, that the particles sucked in within an interval between two cleaning or maintenance operations of the turbomachine as a whole may only cause a certain degree of fouling or damage. In particular, the pressure difference between the pressure p at the inlet of a filter stage and the pressure $p'$ at the outlet of such filter stage can be retrieved from a database, since it is one of the important parameters for a filter and is measured accordingly for each filter available on the market using a standardized procedure.

In an additional particularly advantageous embodiment, the sensitivity spectrum $S(d, M)$ and/or the concentration $n(d, M)$, $n'(d, M)$ also depend on the material M of the particles; that is, on the chemical composition of the particles. If, in this manner, it is taken into account that the interaction of the particles with the filter or with the turbomachine is dependent on the material, the separation in the filter or the impairing effect of transmitted particles on the turbomachine can be determined more precisely. For example, hard particles such as grains of sand cause more erosion in the turbomachine, while reactive particles such as salt crystals contribute more to corrosion in the turbomachine. A particle is deposited in the filter when it is bound to the filter material by a physical force effect, such as an electrostatic force or a Van der Waals force. Such force effects depend on the material.

It is advantageous to select a filter assembly from multiple stages connected in series in the direction of air flow. As previously explained, in particular the interactions between the filter stages, which result from the fact that each filter stage generates a pressure difference through its flow resistance, can then be taken into account.

The filter assembly is advantageously formed from one or more filter candidates in such a manner that the flow resistance of the filter assembly is optimized under a predetermined boundary condition for the quality rating. The lower the flow resistance, the lower the pressure loss and the better the efficiency of the turbomachine. At the same time, the presence of only the required quantity of filter material in the air supply causes only the required quantity of particles to be deposited. This delays the inevitable point in time at which the absorption capacity of the filter is exhausted and the filter has to be replaced.

Therefore, in an additional advantageous arrangement, the optimization is carried out under an additional boundary condition regarding the service life of at least one filter stage. In this manner, an appropriate compromise solution can also be found for a conflict of objectives between this service life, the performance of the turbomachine and the service life of the turbomachine. If the filter is more effective, the performance of the turbomachine is reduced by the increased flow resistance. In return, the service life of the turbomachine is increased and the maintenance effort is reduced, as fewer particles act on it. This, however, is in turn purchased at the expense of the filter being rather full and having to be replaced. A less effective filter is full later, and due to the lower flow resistance, the turbomachine delivers more power in the here and now. In return, it must be cleaned or serviced earlier because more particles enter it.

From the above considerations, it follows that the invention, detached from the preliminary design, generally also refers to a method for operating a filter assembly for the air supply to a turbomachine.

This method determines a current and/or expected concentration $n(d)$ of particles in the air present at the inlet of at least one filter stage as a function of the mean size d of the particles. For at least one filter present in the filter stage, the concentration $n'(d)$ of the particles to be expected at the outlet of the filter stage is calculated from the concentration $n(d)$ and the filter properties of the filter. The expected pressure p' of the air at the outlet of the filter stage is calculated from the pressure p of the air at the inlet of the filter stage and the filter properties of the filter. A sensitivity spectrum $S(d)$ is calculated that, depending on the mean size d of the particles, indicates the extent to which a predetermined concentration of such particles has a negative effect on the performance and/or service life of the turbomachine.

A loss of performance L of the turbomachine is calculated from the concentration $n'(d)$ of the particles, the pressure p' of the air at the outlet of the filter stage and the sensitivity spectrum $S(d)$.

Such loss of performance L can, for example, be coupled to the quantity Q of particles entering the turbomachine. The concentration $n'(d)$ and the pressure p' give rise to a quantity flow, and integration over time provides the quantity Q. It has been recognized that, for example, the loss of efficiency of the turbomachine as a result of fouling depends in particular on the total amount of particles deposited in the turbomachine. The extent of damage caused by erosion and/or corrosion, for example, can also be significantly determined by the total dose of particles since the last maintenance operation. Thus, the calculation of the loss of performance L advantageously includes the calculation of the quantity Q of particles entering the turbomachine.

If the loss of performance L is determined, the point in time at which cleaning or maintenance of the turbomachine is necessary can be determined depending on its condition. It is no longer absolutely necessary to carry out this cleaning or maintenance after a fixed cycle of operating hours, whereby a certain amount of remaining operating time is always "wasted" due to the necessary safety precautions.

Therefore, in a particularly advantageous arrangement, in response to the fact that the loss of performance L exceeds a predetermined threshold value, an online washing process of the turbomachine is triggered and/or maintenance of the turbomachine is requested.

As already mentioned at the beginning, the concentration $n(d)$ of particles at the inlet of the filter stage does not have to be static but can, for example, change seasonally or due to weather conditions. Therefore, the invention also generally refers to a method for operating a filter assembly for the air supply to a turbomachine. With this method, the effective strength, and/or the filter type, of at least one filter stage of the filter assembly are updated for a change in the current, and/or expected, concentration $n(d)$ of particles at the inlet of such filter stage.

The effect of such updating for the concentration $n'(d)$ of the particles to be expected at the outlet of the filter stage and/or on the pressure p' of air to be expected at the outlet of the filter stage can be determined, in particular in an analogous manner, as previously described for the method for designing and/or controlling a filter assembly. Thus, the relevant scope of disclosure is fully usable for the method for operation.

As previously indicated, this allows the supply air filtration for the turbomachine to be adjusted to the actual demand. If, for example, the ambient air is very clean after heavy rainfall, a significantly weaker filtration can be set, which allows a larger mass flow of air to pass through to the turbomachine. A filter specially designed for pollen or Sahara dust, for example, can also be switched on if such particles are actually to be expected in the ambient air. Such special filters are then not unnecessarily dirty, on the one hand, and do not constantly contribute to the flow resistance of the filter assembly, on the other hand.

For example, the effective strength of the filter stage can be adjusted by increasing or decreasing the effective flow cross-section of a bypass line circumventing the filter stage. A directional valve or a proportional valve, for example, can be used for this purpose.

However, it is also possible to select a filter stage with a filter, for example, the effect of which can be activated by applying an electrical voltage to the filter and/or by driving an electrical current through the filter. The effective strength of the filter stage can then be adjusted by increasing or decreasing the electrical voltage and/or the electrical current. An example of this is an electrostatic precipitator, in which dust particles are charged via spray electrodes so that they are subsequently deposited on separating electrodes.

In all methods described, the current concentration $n(d)$ of particles at the inlet of the filter stage can be calculated advantageously from a measurement of the concentration of particles in the ambient air of the filter assembly. In this case, it is possible to react particularly quickly to a change, for example to a decrease as a result of a rain shower or to an increase due to construction work in the vicinity of the turbomachine.

Furthermore, in all methods described, a current and/or expected concentration of particles in the ambient air of the filter assembly can be obtained from an external data source and used to determine the current and/or expected concentration $n(d)$ of particles at the inlet of the filter stage. For example, with the assistance of weather data from a weather service, it can be predicted that rain will fall or that Sahara dust will be blown to the location of the turbomachine.

In particular, the methods described can be fully or partially computer-controlled. In particular, corresponding software can, for example, be sold as an update or upgrade for existing design or control software, and is an independent product to this extent. Therefore, the invention also refers to a computer program with machine-readable instructions that, when executed on a computer, and/or on a controller, and/or on an embedded system, cause the computer, controller, or embedded system, respectively, to perform one or more of the methods described. The invention also refers to a machine-readable data carrier or a download product with the computer program.

The methods are particularly applicable to gas turbines and compressors as turbomachines, for example, but are not limited to these.

FIG. 1 schematically shows the effect of a filter assembly 1, which is arranged before an air supply 2 to a turbomachine 3, and illustrates the variables involved.

The filter assembly 1 contains filter stages 11-13 connected in series. For the sake of clarity, only the effect of the first filter stage 11 is more specifically shown in FIG. 1, while the presence of the other filter stages 12, 13 is merely indicated.

The turbomachine 3 sucks in air that has a pressure p before the first filter stage 11. The filter stage 11 causes a pressure loss towards a lower pressure p'. The object of the filter stage 11 is to filter particles 4 out of the air. Each particle 4 has a size d and consists of the material M. The particles 4 are present before the filter stage 11 in a concentration n(d, M) which depends both on the mean size d and on the material M of the particles 4. Such concentration n(d, M) is reduced by filter stage 11 to a concentration n'(d, M).

When designing the filter assembly 1, various filter candidates 14 for the filter stage 11 can be tested and evaluated with a quality rating 14a not shown in FIG. 1 to determine how well the respective filter performance fits the requirements of the turbomachine 3.

The requirements of the turbomachine 3 for filter performance are to be found in the sensitivity spectrum S(d, M), which indicates how disruptively particles 4 with a mean size d consisting of the material M affect the operation or service life of the turbomachine 3. The corresponding diagram in FIG. 1 is drawn in two dimensions for the sake of clarity. It should actually be a three-dimensional curve, the height S(d, M) of which depends on the coordinates d and M.

FIG. 1 indicates that the filter stage 11 can be bridged by a bypass line 15. Thus, for example, the filter performance can be adjusted to a changing concentration n(d, M) of the particles 4 in the supply air.

Figure 2:
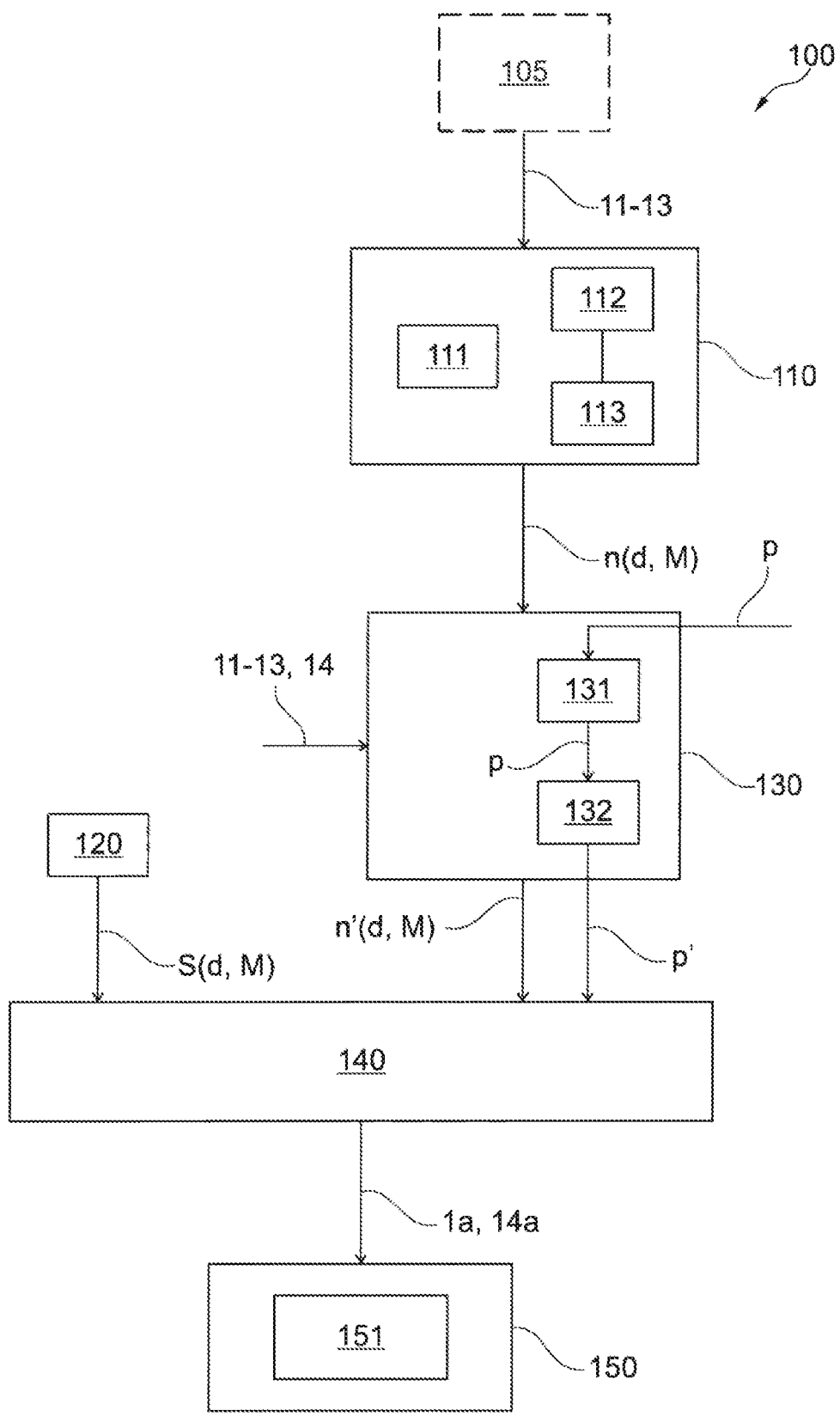
FIG. 2: Embodiment of the method 100 for controlling and/or designing a filter assembly 1.

FIG. 2 shows an embodiment of the method 100 for the design and/or control of the filter assembly 1. In the optional step 105, a filter assembly 1 of multiple filter stages 11-13 is selected.

In step 110, the concentration n(d, M) of the particles 4 at the inlet of at least one filter stage 11-13 is determined. According to block 111, this can take place by means of direct measurement. Alternatively, or in combination, a particle concentration in ambient air may be retrieved from an external data source according to block 112 and used to determine the concentration n(d, M) according to block 112.

In step 130, the particle concentration n'(d, M) to be expected at the outlet of the filter stage 11-13 is determined. In particular, according to block 131, the pressure p of the air at the inlet of the filter stage can also be used, and according to block 132, the expected pressure p' at the outlet of the filter stage 11-13 can also be calculated.

Independent of this, the sensitivity spectrum S(d, M) of the turbomachine 3 to the particles 4 is calculated in step 120. From this sensitivity spectrum S(d, M) in conjunction with the remaining concentration n'(d, M) of particles and the pressure p' at the outlet of the filter stage 11-13, in step 140, a quality rating 14a is calculated for the filter candidate 14 currently used in filter stage 11-13 or a quality rating 1a for the filter assembly 1 as a whole. In step 150, such filter candidates 14 that optimize the flow resistance of the filter assembly 1 while adhering to a specified boundary condition for the quality rating 1a, 14a can then be found. According to block 151, the service life of at least one filter stage 11-13 can form a further boundary condition.

Figure 3:
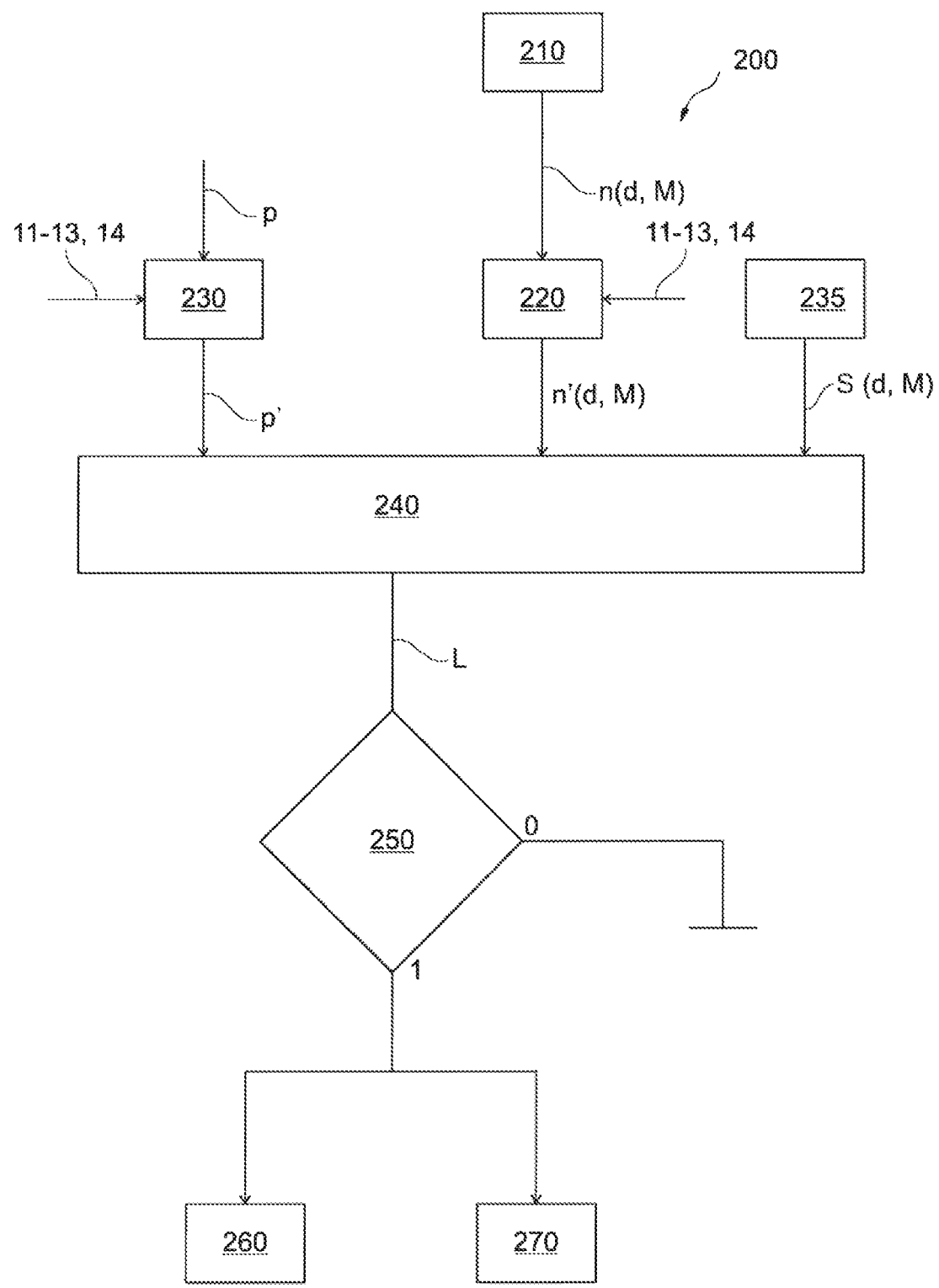
FIG. 3: Embodiment of the method 200 for operating a filter assembly 1.

FIG. 3 shows an embodiment of the method 200 for operating a filter assembly 1. In step 210, the concentration n(d, M) of particles 4 at the inlet of at least one filter stage 11-13 is calculated. In step 220, the concentration n'(d, M) of particles 4 to be expected at the outlet of the filter stage 11-13 is calculated. Furthermore, in step 230, the pressure loss from the pressure p at the inlet side to the pressure p' at the outlet side is calculated. In step 235, the sensitivity spectrum S(d) is calculated which, depending on the mean size d of particles 4, indicates the extent to which a predetermined concentration of these particles 4 has a negative effect on the performance and/or service life of the turbomachine 3. In step 240, the loss of performance L is calculated from the concentration n'(d, M), the pressure p' at the outlet side and the sensitivity spectrum S(d).

In step 250, whether the loss of performance L exceeds a predefined threshold value is checked. If the threshold value is not exceeded (logical value 0), nothing is to be done. If the threshold value is exceeded (logical value 1), an online washing process of the turbomachine 3 is triggered in step 260, and/or maintenance of the turbomachine 3 is requested in step 270.

Figure 4:
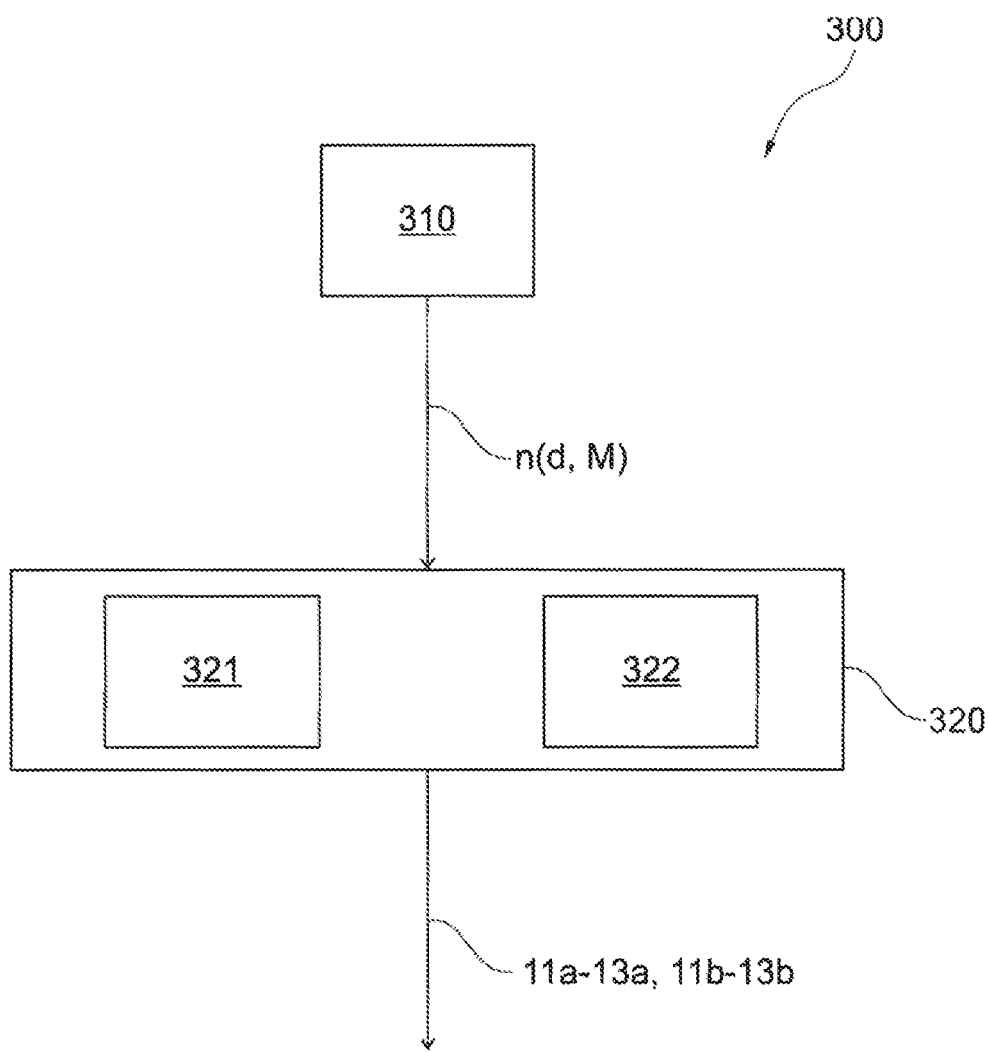
FIG. 4: Embodiment of the method 300 for operating a filter assembly 1.

FIG. 4 shows an embodiment of the method 300 for operating a filter assembly 1. In step 310, the change in the current, and/or expected, concentration n(d, M) of the particles is detected at the inlet of the filter stage 11-13. In step 320, there is a reaction to this by an adjustment of the effective strength 11a-13a, and/or the filter type 11b-13b, of the filter stage 11-13. According to block 321, the effective flow cross-section of the bypass line 15 can be changed for this, for example by opening or closing a valve. According to block 322, the electrical control of the filter stage 11-13 can be changed.

While the invention has been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below. Additionally, statements made herein characterizing the invention refer to an embodiment of the invention and not necessarily all embodiments.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or

LIST OF REFERENCE SIGNS

1 Filter assembly
1a Quality rating for filter assembly 1
11-13 Filter stages of filter assembly 1
11a-13a Effective strengths of filter stages 11-13
11b-13b Filter types of filter stages 11-13
14 Filter candidate for filter stage 11-13
14a Quality rating for filter candidate 14
15 Bypass line in filter assembly 1
2 Air supply to turbomachine 3
3 Turbomachine
4 Particles
100 Method for designing and/or controlling the filter assembly 1
105 Selection of a filter assembly 1 with stages 11-13
110 Calculation of the concentration n(d, M) of particles 4
111 Measurement of concentration n(d, M)
112 Query of external data source regarding concentration
113 Calculation of concentration n(d, M) with external data
120 Calculation of sensitivity spectrum S(d, M)
130 Calculation of concentration n'(d, M) after filter stage 11-13
131 Consideration of pressure p before filter stage 11-13
132 Calculation of pressure p' after filter stage 11-13
140 Calculation of quality rating 1a, 14a
150 Optimization with boundary condition for quality rating 1a, 14a
151 Service life of a filter stage 11-13 as a boundary condition
200 Method for operating filter assembly 1
210 Calculation of concentration n(d, M) of particles 4
220 Calculation of concentration n'(d, M) after filter stage 11-13
230 Calculation of pressure p' after filter stage 11-13
235 Calculation of sensitivity spectrum S(d)
240 Calculation of loss of performance of turbomachine 3
250 Check of whether threshold value for loss of performance L is exceeded
260 Triggering of an online washing process of turbomachine 3
270 Request for a maintenance of turbomachine 3
300 Method for operating filter assembly 1
310 Detection of a change in concentration n(d, M)
320 Adjustment of effective strength 11a-13a and/or filter type 11b-13b
321 Changing of flow cross-section of bypass line 15
322 Change of electrical control of filter stage 11-13
d Size of particles 4
L Loss of performance of turbomachine 3
M Material of particles 4
n Concentration of particles 4 before filter stage 11-13
n' Concentration of particles 4 after filter stage 11-13
p Air pressure before filter stage 11-13
p' Air pressure after filter stage 11-13
Q Quantity of particles 4 entering turbomachine 3
S Sensitivity spectrum of turbomachine 3

What is claimed is:

1. A method for designing a filter assembly for an air supply to a turbomachine, comprising:

calculating a current and/or an expected concentration of particles in air present at an inlet of at least one filter stage of the filter assembly as a function of a mean size of the particles;

calculating a sensitivity spectrum that, depending on the mean size of the particles, indicates an extent to which a predetermined concentration of such particles has a negative effect on performance and/or on service life of the turbomachine by erosion and/or chemical corrosion;

calculating, for at least one filter candidate usable in the filter stage and/or switchable on or off, a concentration of particles to be expected at an outlet of the filter from a concentration and filter properties of the at least one filter candidate;

calculating a quality rating from the concentration and a sensitivity spectrum;

assigning the at least one filter candidate and/or the filter assembly; and forming the filter assembly from one or more filter candidates in such a manner that a flow resistance of the filter assembly is optimized under a predetermined boundary condition for the quality rating.

2. The method according to claim 1, wherein a pressure of the at the inlet of the filter stage is additionally used to determine the concentration of the particles to be expected at the outlet of the filter stage depending on the mean size of the particles.

3. The method according to claim 2, wherein in addition to the expected concentration of the particles at the outlet of the filter stage, an expected pressure of the air at the outlet of the filter stage is also calculated.

4. The method according to claim 1, wherein the sensitivity spectrum and/or the concentrations also depend on a material of the particles.

5. The method according to claim 1, wherein a filter assembly is selected from multiple stages connected in series in a direction of air flow.

6. The method according to claim 1, wherein the optimization is carried out under an additional boundary condition regarding the service life of at least one filter stage.

7. The method according to claim 1, wherein the current concentration of particles at the inlet of the filter stage is calculated from a measurement of a concentration of particles in ambient air of the filter assembly.

8. The method according to claim 1, wherein a current and/or expected concentration of particles in ambient air of the filter assembly is obtained from an external data source and is used to determine a current and/or expected concentration of particles at the inlet of the filter stage.

9. A computer program containing machine-readable instructions that, when executed on a computer, and/or on a controller, and/or on an embedded system, cause the computer, controller, or embedded system, respectively, to perform a method for designing a filter assembly for an air supply to a turbomachine, the method comprising:

calculating a current and/or an expected concentration of particles in air present at an inlet of at least one filter stage of the filter assembly as a function of a mean size of the particles;

calculating a sensitivity spectrum that, depending on the mean size of the particles, indicates an extent to which a predetermined concentration of such particles has a negative effect on performance and/or on service life of the turbomachine by erosion and/or chemical corrosion;

calculating, for at least one filter candidate usable in the filter stage and/or switchable on or off, a concentration of particles to be expected at an outlet of the filter from a concentration and filter properties of the at least one filter candidate;

calculating a quality rating from the concentration and a sensitivity spectrum;

assigning the at least one filter candidate and/or the filter assembly; and forming the filter assembly from one or more filter candidates in such a manner that a flow resistance of the filter assembly is optimized under a predetermined boundary condition for the quality rating.

* * * * *